United States Patent [19]

Kueck et al.

[11] Patent Number: 5,612,601

[45] Date of Patent: Mar. 18, 1997

[54] METHOD FOR ASSESSING MOTOR INSULATION ON OPERATING MOTORS

[75] Inventors: John D. Kueck; Pedro J. Otaduy, both of Oak Ridge, Tenn.

[73] Assignee: Martin Marietta Energy Systems, Inc., Oak Ridge, Tenn.

[21] Appl. No.: 568,550

[22] Filed: Dec. 7, 1995

Related U.S. Application Data

[63] Continuation of Ser. No. 155,260, Nov. 22, 1993, abandoned.

[51] Int. Cl.[6] ............................................. G01R 31/06
[52] U.S. Cl. .......................... 318/449; 318/455; 318/490; 324/522; 324/557; 324/650
[58] Field of Search .................................. 318/449, 450, 318/452, 453, 478, 479, 490, 558, 455; 324/500, 512, 522, 557, 558, 600, 647, 649, 650

[56] References Cited

U.S. PATENT DOCUMENTS

| | | |
|---|---|---|
| 3,668,469 | 6/1972 | Lee . |
| 3,970,897 | 7/1976 | Tamir et al. . |
| 4,319,298 | 3/1982 | Davis et al. ............................... 361/24 |
| 4,377,784 | 3/1983 | Saito et al. . |
| 4,761,703 | 8/1988 | Kliman et al. ............................. 361/23 |
| 4,766,387 | 8/1988 | Browne et al. . |
| 4,897,607 | 1/1990 | Grünewald et al. . |
| 4,922,172 | 5/1990 | Roddy et al. ............................. 318/490 |
| 4,965,513 | 10/1990 | Haynes et al. . |
| 5,126,678 | 6/1992 | Williams . |
| 5,270,640 | 12/1993 | Kohler et al. ......................... 324/158.1 |

OTHER PUBLICATIONS

*Modern Power Systems;* John R. Neuenswander (Principal Engineer, Detroit Edison Company); International Textbook Company – College Division—Intext Educational Publishers; pp. 155–166, 1971.

*Primary Examiner*—Bentsu Ro
*Attorney, Agent, or Firm*—Edward A. Pennington; James M. Spicer; Harold W. Adams

[57] ABSTRACT

A method for monitoring the condition of electrical-motor-driven devices. The method is achieved by monitoring electrical variables associated with the functioning of an operating motor, applying these electrical variables to a three phase equivalent circuit and determining non-symmetrical faults in the operating motor based upon symmetrical components analysis techniques.

18 Claims, 9 Drawing Sheets

NORMAL BALANCED CONDITIONS

FIG. 11b

NOTE:
AT THE FAULT
$V_{ab} = V_{bc} = V_{ca} = 0$

THREE PHASE FAULT

FIG. 11c

NOTE:
AT THE FAULT $V_{bc} = 0$

FIG. 11d

NOTE:
AT THE FAULT
$V_{bc} = V_{bg} = V_{cg} = 0$

FIG. 11e

NOTE:
AT THE FAULT $V_{ag} = 0$

ASSUMES $Z_1 = Z_2 = Z_0$

METHOD FOR ASSESSING MOTOR INSULATION ON OPERATING MOTORS

This invention was made with Government support under contract DE-AC05-84OR21400 awarded by the U.S. Department of Energy to Martin Marietta Energy Systems, Inc. and the Government has certain rights in this invention.

This is a continuation of application Ser. No. 08/155,260, filed on Nov. 22, 1993, now abandoned.

FIELD OF THE INVENTION

The invention relates to monitoring the condition of electrical-motor-driven devices. More particularly, the subject invention relates to the use of symmetrical components analysis to monitor real-world (unsymmetrical) faults in operating motors.

BACKGROUND OF THE INVENTION

Electrical-motor-driven devices have become an integral part of life, and the availability of techniques for easily, efficiently, and reliably monitoring such motors is a necessity. A major cause of failure in polyphase electrical-motor-driven devices is the breakdown of the insulation which protects the motor windings. Service conditions, such as voltage imbalance, local high temperature ambient, etc., often have a significant negative effect on motor insulation. Such breakdown often necessitates expensive and time consuming repairs to the motor. Consequently, a need exists for a method to determine motor insulation conditions without de-energizing the motor.

Traditionally, motors have been protected from sudden failure by circuit breakers and temperature switches which respond to excessive current or temperature by shutting down the motor before it fails. However, these devices fail to disclose the cause of the problem or warn a user of the impending problem.

Other devices employ an AC signal to monitor insulation faults. However, these systems typically require complex electronics and coupling devices. Certain other systems utilize a simpler DC detection circuit. However, such systems typically can be used only when the motor is not operating.

In contrast to the prior art discussed above, U.S. Pat. No. 4,766,387, to Browne et al., discloses a method for monitoring the motor winding insulation resistance of a polyphase motor while the motor is running. The method is achieved by selectively disconnecting each winding from its respective phase power source and reconnecting that winding with an insulation measuring circuit. The insulation measuring circuit applies a test voltage to the winding so that the leakage resistance can be measured while the remaining windings continue to operate the motor.

Another method for monitoring faults in electrical installations is disclosed by Grunewald et al. in U.S. Pat. No. 4,897,607. The method is achieved by performing partial discharge measurements and high-frequency measurements at least at one location in the electrical installation, and optionally in all phases. The measurements are then compared with each other, and with the calibration signals, before conclusions are drawn regarding the location and the type of fault. Next, measurements at least at three measuring points are continuously and periodically performed while the electrical installation is in operation. A computer simulation of the electrical installation as a high-frequency network is then created, while simulating fault with the signal originating therefrom at the measuring points. The measurement values which indicate faults are then compared with the simulated signal values for different fault types and fault locations. Finally, the type and location of the faults are determined from the simulated values which best agree with the measurement values, and from the corresponding simulated fault.

Other fault detecting devices are disclosed in U.S. Pat. No. 5,126,678 to Williams and U.S. Pat. No. 4,377,784 to Saito et al.. The patent to Williams discloses a fault detector which monitors the phase difference between two line-to-line voltage of a generator, and compares the phase difference with a predetermined value or range of values to indicate a fault. The patent to Saito et al. discloses a fault detection apparatus which relies upon the pulsing magnetic flux waveform produced by a rotary machine to determine the presence or absence of faults.

In addition, symmetrical components analysis applied to non-symmetrical systems, as will be subsequently discussed in greater detail, has been used for some time. John R. Neuenswander, Modern Power Systems, International Textbook Co., 1971, pp. 155–166. However, the analysis has been limited in its application, and has been primarily used to determine faults in electrical transmission systems.

The prior art discussed above fails to disclose a convenient, efficient and reliable method for monitoring faults in an electrical motor driven device. The subject invention overcomes the shortcomings of the prior art by providing a method which utilizes a three phase equivalent circuit and symmetrical components analysis techniques to monitor real-world (unsymmetrical) faults in operating electrical motors.

SUMMARY OF THE INVENTION

It is, therefore, an object of the invention to monitor non-symmetrical faults in operating motors.

It is also an object of the invention to use a poly-phase equivalent circuit and symmetrical components analysis techniques to monitor real-world (unsymmetrical) faults in operating motors.

It is another object of the invention to provide a method and apparatus for monitoring phase-to-phase and two-phase-to-ground faults in the windings of poly-phase motors.

It is a further object of the invention to provide a method and apparatus for assessing insulation degradation while the motor is operating.

It is also another object of the invention to provide a method and apparatus wherein current imbalance is compared with three phase bus terminal voltage to verify that the imbalance is occurring as a result of insulation degradation in the operating motor.

It is also a further object of the invention to provide a method and apparatus wherein phase-to-phase insulation is assessed by examining current imbalance for phase distortion characteristic of a line-to-line fault.

These and other objects are achieved by the subject invention which provides a method and apparatus for monitoring the condition of electrical-motor-driven devices. The method is achieved by monitoring electrical variables associated with the functioning of an operating motor, and using these electrical variables to determine non-symmetrical faults in the operating motor based upon a poly-phase equivalent circuit and symmetrical components analysis. It should be noted that the prefix poly- as used throughout this application refers to any multiple integer, including one.

By using a three-phase equivalent circuit and symmetrical components analysis as applied to non-symmetrical faults, it is possible to accurately, efficiently, and consistently determine the location of faults, in electrical-motor-driven devices. As a result, the degradation of insulation in electrical motors can be monitored. Other objects, advantages and salient features of the invention will become apparent from the following detailed description, which taken in conjunction with the annexed drawings discloses a preferred, but non-limiting, embodiment of the subject invention.

DETAILED DESCRIPTION OF THE PREFERRED EMBODIMENT

The subject invention is a method and apparatus for calculating motor insulation conditions based upon variables monitored when a poly-phase electrical motor is in operation. The subject invention utilizes a three-phase equivalent circuit and symmetrical components analysis to determine non-symmetrical faults in electrical motors.

The subject invention specifically addresses the monitoring of conventional three-phase electrical motors. Such motors are very well known in the art and generally include three phased windings which are protected by insulation. As the insulation degrades, and other components of the motor degrade, faults become apparent in the phases of the motor. Typically, electrical faults occurring in electrical motors are phase-to-phase or two-phase-to-ground faults in the motor windings, and are thus non-symmetrical faults. The subject invention provides a method and apparatus for monitoring insulation degradation and the development of faults in the phases.

Briefly, the method is achieved by monitoring electrical variables associated with the functioning of an operating motor, and applying the electrical variables to a three-phase equivalent circuit and determining non-symmetrical faults in the operating motor based upon symmetrical components analysis.

Figure 1:
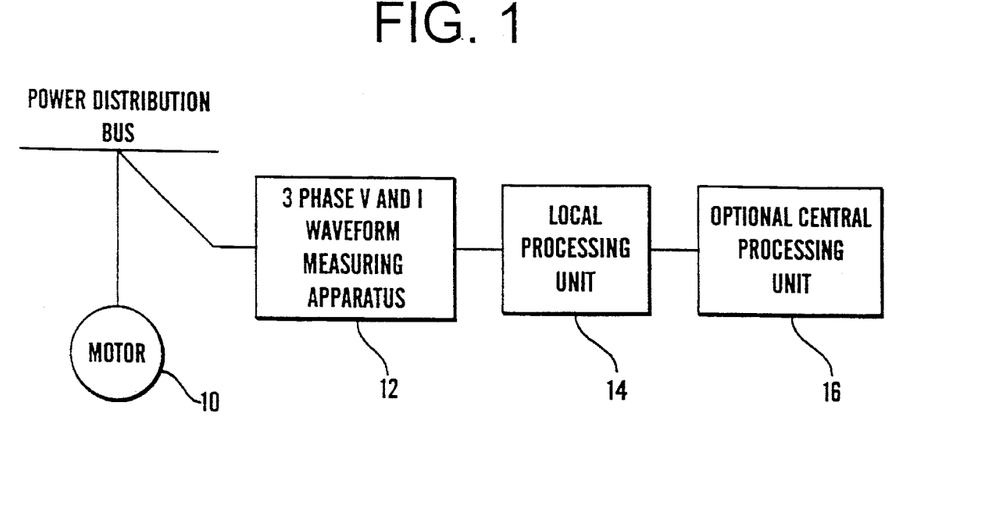
FIG. 1 is a schematic of the subject invention.

As shown in FIG. 1, the current, voltage, and angles of a three-phase electrical motor 10 are measured. Specifically, the three-phase currents and voltages are measured at the source of the motor power by any conventional diagnostic tool capable of measuring the necessary variables 12. However, the currents and voltages may also be measured at the motor terminals if it is more convenient to make the measurements in that manner. The measured variables are then input to a central processing unit 14 having software for applying a three-phase equivalent circuit and symmetrical components analysis to the input measured variables. As will be shown in greater detail below, application of the three-phase equivalent circuit and symmetrical components analysis to the input measured variables provides an individual with the magnitude of the fault impedances. This information is then processed by the local processing unit 14, or an optional central processing unit 16, to determine faults within the motor phases.

John R. Neuenswander sets forth the mathematical approach for analyzing non-symmetrical faults by utilizing a three-phase equivalent circuit and symmetrical components analysis techniques. The following analysis has primarily been applied to electrical transmission systems to detect faults therein. However, until the subject invention, the following analysis had not been used in a method to determine degradation of induction motors. With regard to line-to-line faults, your attention is directed to FIG. 2 which discloses a three-phase system with a line-to-line short circuit between phase b and c.

Figure 2:
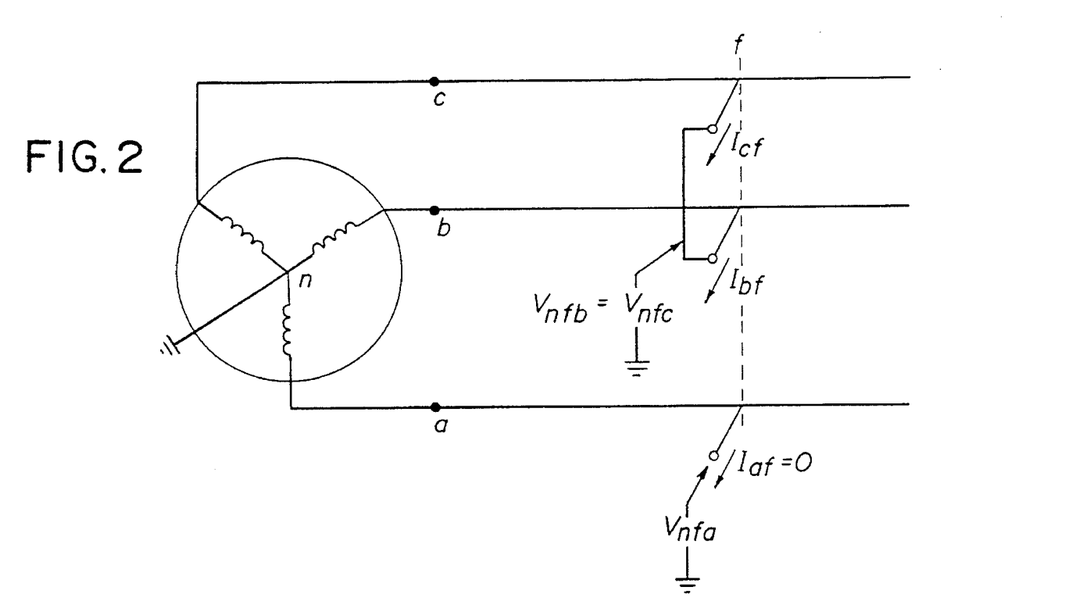
FIG. 2 is a circuit diagram representative of a line-to-line fault.

Since $I_{af}=0$ and $I_{bf}=-I_{cf}$, $$I_{af}^0 = \tfrac{1}{3}[I_{af}^0 + I_{bf} + I_{cf}]$$

or $$I_{af}^0 0 \qquad (1)$$

Zero-sequence currents and voltages are absent here. Solving for $I_{af}$, where $I_{bf}=-I_{cf}$:

$$I_{af}^+ = \tfrac{1}{3}[I_{af}^0 + aI_{bf} + a^2 I_{cf}] \qquad (2)$$

$$= \tfrac{1}{3}[I_{bf}\angle 120° - I_{bf}\angle -120°]$$

$$= \frac{I_b \angle 90°}{\sqrt{3}}$$

$$I_{af}^- = \tfrac{1}{3}[I_{af}^0 + a^2 I_{bf} + aI_{cf}] \qquad (3)$$

$$= \tfrac{1}{3}[I_{bf}\angle -120° - I_{bf}\angle +120°]$$

$$= \frac{I_{bf}\angle -90°}{\sqrt{3}}$$

When Eqs. 2 and 3 are compared we find that $$I_{af}^- = -I_{af}^+ \qquad (4)$$

Continuing our analysis, it is apparent from FIG. 2 that $$V_{nfb} = V_{nfc} \qquad (5)$$

And solving for the sequence voltages at the fault locations we find that $$V_{nfa}^- = \frac{1}{3} [V_{nfa} + \alpha V_{nfb} + \alpha^2 V_{nfc}] \quad (6)$$

$$= \frac{1}{3} [V_{nfa} + \alpha V_{nfb} + \alpha^2 V_{nfb}]$$

$$= \frac{1}{3} [V_{nfa} - V_{nfb}]$$

and $$V_{nfa} = \frac{1}{3} [V_{nfa} + a^2 V_{nfb} + a V_{nfc}] \quad (7)$$

$$= \frac{1}{3} [V_{nfa} + a^2 V_{nfb} + a V_{nfb}]$$

$$= \frac{1}{3} [V_{nfa} - V_{nfb}]$$

which leads to the conclusion that $$V_{nfa}^+ = V_{nfa}^- \quad (8)$$

Figure 3:
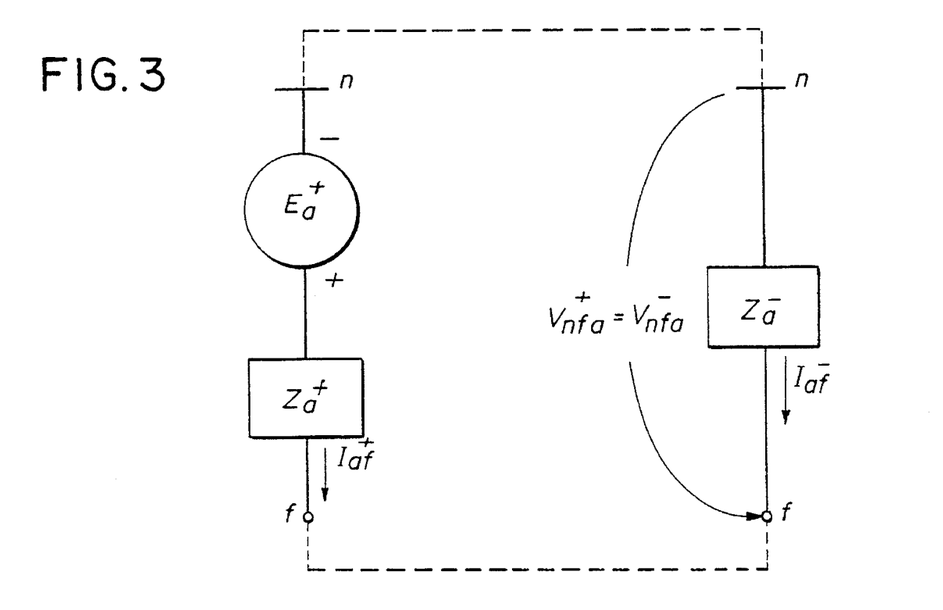
FIG. 3 is a line-to-line equivalent circuit for phase a of a three-phase electrical motor.

Equations 1, 4, and 8 suggest a simple equivalent circuit in the solution of the line-to-line fault. The circuit satisfies these equations in every respect. FIG. 3 shows the neutral buses of positive and negative networks joined together.

The solution procedure for the analysis of the line-to-line faults discussed above is as follows:

1. Obtain $I_{af}^+$ and $I_{af}^-$. From the equivalent circuit, $$I_{af} = \frac{E_a^-}{Z^+ Z^-} \quad (9)$$

and $$I_{af}^- = - I_{af}^+ \quad (4)$$

2. Find the fault currents $I_{bf} = -I_{cf}$ $$I_{bf} = I_{bf}^+ + I_{bf}^- + I_{bf}^0$$

$$= I_{af}^+ \angle -120° + I_{af}^- \angle +120°$$

substituting, $$I_{bf} = I_{af}^+ \angle -120° - I_{af}^+ \angle 120° \quad (10)$$
$$I_{bf} = \sqrt{3} \, I_{af}^+ \angle -90° = -I_{cf}$$

3. Find the voltages above ground at the fault.

$$V_{nfa} = V_{nfa}^+ + V_{nfa}^- + \theta_{nfa}^0$$

$$V_{nfa} = 2 V_{nfa}^+ = 2 V_{nfa}^- \quad (11)$$

where $$V_{nfa}^+ = E_a^+ - I_{af}^+ Z^+$$

or $$V_{nfa}^+ = -I_{af}^- Z^-$$

[Note: In the special case where $Z^+ = Z^-$, half of $E_a^+$ will drop across $Z_a^-$ and $$V_{nfa} = 2 V_{nfa}^- = 2 \frac{E_a^-}{2} = E_a^+$$

4. Finding the voltage above ground for phases b and c.

$$V_{nfc} = V_{nfb} = V_{nfb}^- V_{nfb}^- + V_{nfb}^0 \quad (12)$$

$$= a^2 V_{nfa}^+ + a V_{nfa}^-$$

$$= V_{nfa}^+ (a^2 + a)$$

$$V_{nfc} = V_{nfb} = -V_{nfa}$$

5. Line-to-line voltages at the point of fault may be needed as well. If so, $$V_{ab} = V_{afn} + V_{nfb}$$

$$= -V_{nfa} + V_{nfb}$$

substituting results of Eqs. 11 and 12.

$$V_{ab} = -2 V_{nfa}^+ - V_{nfa}^+ \quad (13)$$
$$V_{ab} = -3 V_{nfa}^+$$
$$V_{bc} = V_{fnb} + V_{nfc} = -V_{nfb} + V_{nfc} + \quad (4)$$
$$= V_{nfa}^+ - V_{nfa}^+$$
$$V_{bc} = 0$$

Equation 14 is also obvious since lines b and c are shorted together.

$$V_{ca} = V_{fnc} + V_{nfa} = -V_{nfc} + V_{nfa} \quad (15)$$

$$= -(-V_{nfa}^+) + 2 V_{nfa}^+$$

$$V_{ca} = 3 V_{nfa}^+ = -V_{ab}$$

Figure 4:
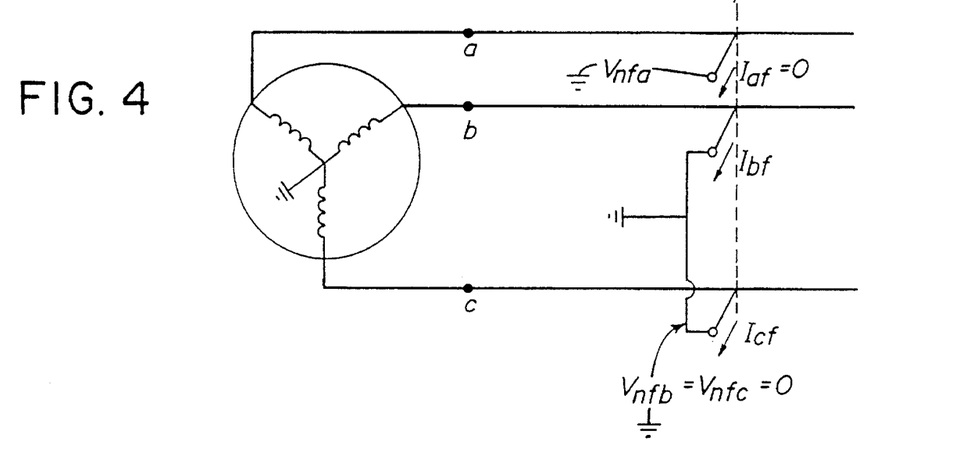
FIG. 4 is a circuit diagram of with a double line-to-ground fault.

In contrast to the line-to-line fault shown in FIG. 1, FIG. 4 reveals a double line-to-ground fault. The simple three-phase system of FIG. 4 shows phase a as the unfaulted phase, whereas phases b and c are both shorted to ground at the location f.

The voltage above ground at the fault location is obviously zero for phases b and c, which leads to the relationship $$V_{nfb} = V_{nfc} = 0 \quad (16)$$

and $$I_{af} = I_{af}^+ + I_{af}^- + I_{af}^0 = 0 \quad (17)$$

The sequences component voltages are $$V_{nfa}^0 = \frac{1}{3} [V_{nfa} + V_{nfb}^0 + V_{nfc}^0]$$

$$= \frac{1}{3} V_{nfa}$$

$$V_{nfa}^+ = \frac{1}{3} [V_{nfa} + 1a \, V_{nfb}^0 + a^2 \, V_{nfc}^0]$$

$$= \frac{1}{3} V_{nfa}$$

$$V_{nfa}^- = \frac{1}{3} [V + _{nfa} + 1 \, V_{nfb}^0 + a \, V_{nfb}^0]$$

$$= \frac{1}{3} V_{nfa}$$

which show that $$V_{nfa}^0 = V_{nfa}^+ = V_{nfa}^- \quad (18)$$

Figure 5:
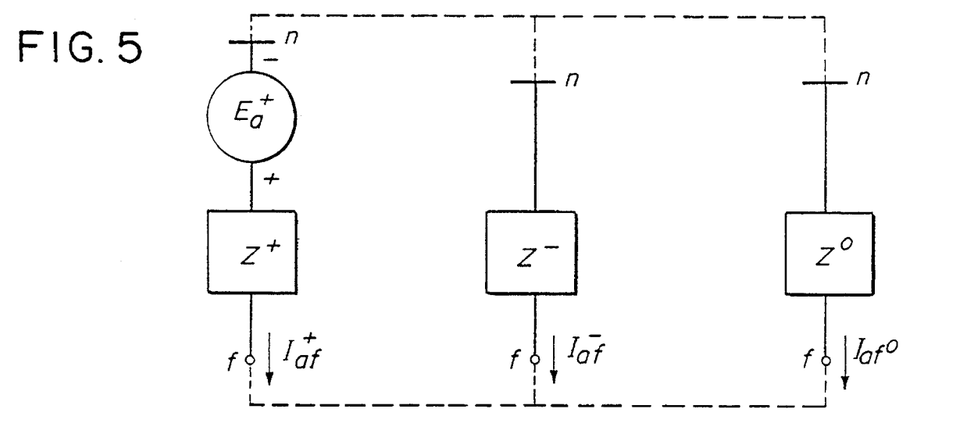
FIG. 5 is a sequence network for a double line-to-ground fault.

As a result of Eqs. 17 and 18 the double line-to-ground sequence network of FIG. 5 is obtained. It should be noted that currents coming out of the fault points are considered to be positive.

The calculation procedure for the double line-to-ground fault is outlined below.

1. From the two fault currents ($I_{bf}$ and $I_{cf}$) will be found. From FIG. 5.

$$I_{af}^- = \frac{E_n^+}{Z^+ + \frac{Z^- Z^0}{Z^- + Z^0}} \quad (19)$$

$$V_{nfa}^+ = E_a^+ - I_{af}^+ Z^+ \quad (20)$$

$$I_{af}^- = \frac{-V_{nfa}^+}{Z^-} \text{ and } I_{af}^0 = \frac{-V_{nfa}^+}{Z^0} \quad (21)$$

$I_{af}^-$ and $I_{af}^0$ could also have determined using the current-divider principle.

$$\begin{aligned} I_{bf} &= I_{bf}^+ + I_{bf}^- + I_{bf}^0 \quad (22) \\ &= I_{af}^+ \angle -120° + I_{af}^- \angle +120° + I_{af}^0 \end{aligned}$$

$$\begin{aligned} I_{cf} &= I_{cf}^+ + I_{cf}^- + I_{cf}^0 \quad (23) \\ &= I_{af}^+ \angle +120° + I_{af}^- \angle -120° + I_{af}^0 \end{aligned}$$

Figure 6:
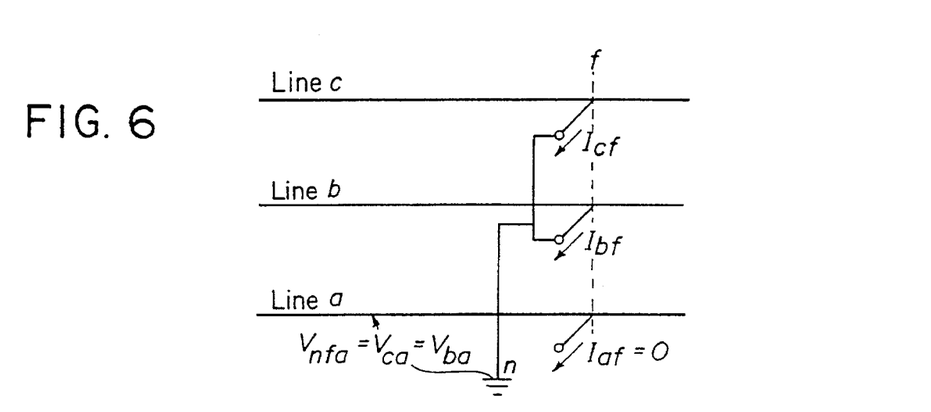
FIG. 6 is a circuit diagram for a double line-to-ground fault as it might appear at the point of a fault.

2. Referring to FIG. 6 we see that $$V_{nfa} = V_{ca} = -V_{ab} \quad (24)$$

where $$V_{nfa} = V_{nfa}^+ + V_{nfa}^- + V_{nfa}^0$$

or $$V_{nfa} = 3 V_{nfa}^+ \quad (25)$$

likewise.

$$V_{ca} = 3 V_{nfa}^+,$$

and $$V_{ab} = -3 V_{nfa}^+$$

Based upon the analysis technique presented above, the magnitude of the fault impedances of the three-phase motor are readily determined based upon the relationship I=V/Z. The fault impedances obtained as a result of the foregoing analysis are indicative of the location and magnitude of faults located within a three-phase electrical motor. Additionally, the fault impedances are indicative of insulation degradation.

The information obtained as a result of the subject method and apparatus can be used to verify imbalances in the motor. Specifically, the current imbalance is compared with the three phase bus terminal voltage to verify that the imbalance is occurring as a result of insulation degradation in the motor. Additionally, phase-to-phase insulation failure is assessed by examining the current imbalance for phase distortion characteristic of a line to line fault. These assessments can be accomplished manually or, more preferably, by local or central processing units 14, 16 loaded with appropriate software.

Figure 7:
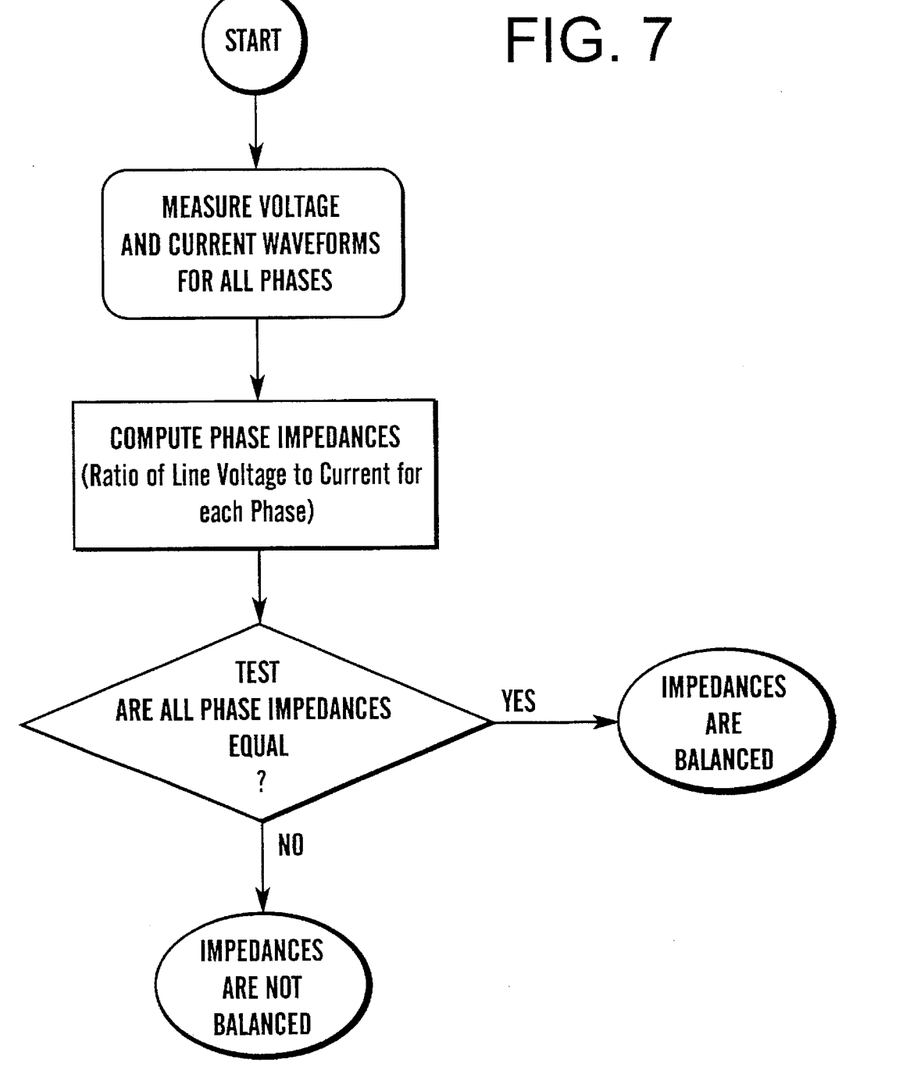
FIGS. 7–10 are flow charts outlining the procedure utilized in accordance with the subject invention.

FIGS. 7–10 outline the procedure for assessing motor insulation in accordance with the subject invention. With reference to FIG. 7, the voltage and current waveforms for all phases of the motor are measured. The phase impedances, i.e., the ratio of line voltage to current for each phase, are then computed. If all the phase impedances are equal, the impedances are balanced. In contrast, if the phase impedances are not equal, the impedances are unbalanced.

Figure 8:
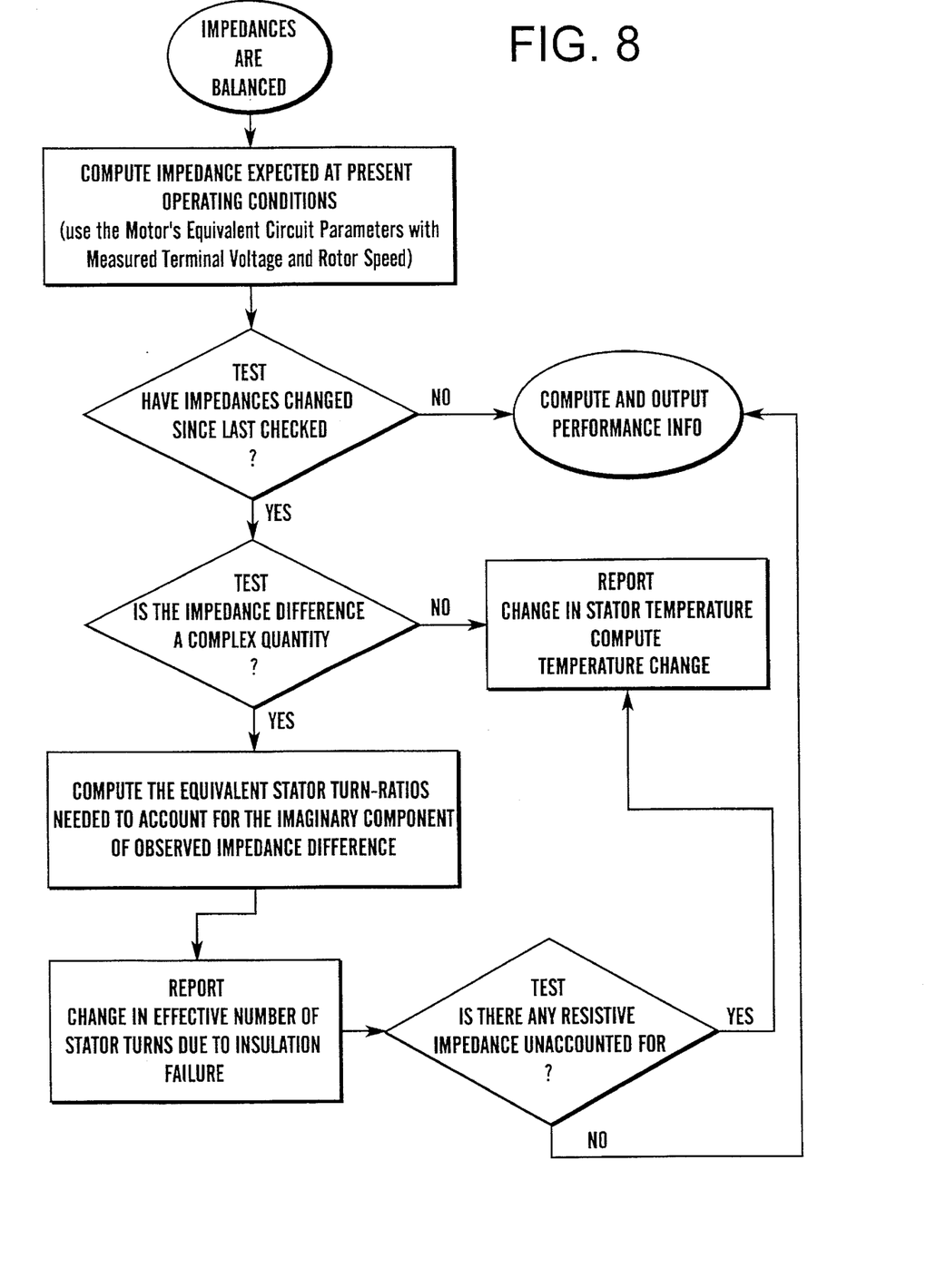

If the phase impedances are balanced, the procedure outlined in FIG. 8 is followed. First, the expected impedance, under the current operating conditions, is computed using the motor's equivalent circuit parameters with measured terminal voltage and rotor speed. If the impedance has not changed, the performance information is then computed and output in a manner that will be subsequently discussed.

If the computed impedance differs from the measured impedance, and the impedance difference is not a complex quantity, then a change in the stator temperature is diagnosed, computed and reported to the user.

If, however, the computed impedance differs from the measured impedance and the difference is a complex quantity, the equivalent stator winding turn-ratios needed to account for the imaginary component of the observed impedance difference are computed. The change in winding turn-ratios is reported if there is no unaccounted resistive impedance, the performance information is computed and output in a manner that will be subsequently discussed. If, however, resistive impedance is unaccounted for, the temperature change that will account for it is computed. The change in stator temperature is reported to the user before the performance information can be computed and output in the manner discussed below.

Figure 9:
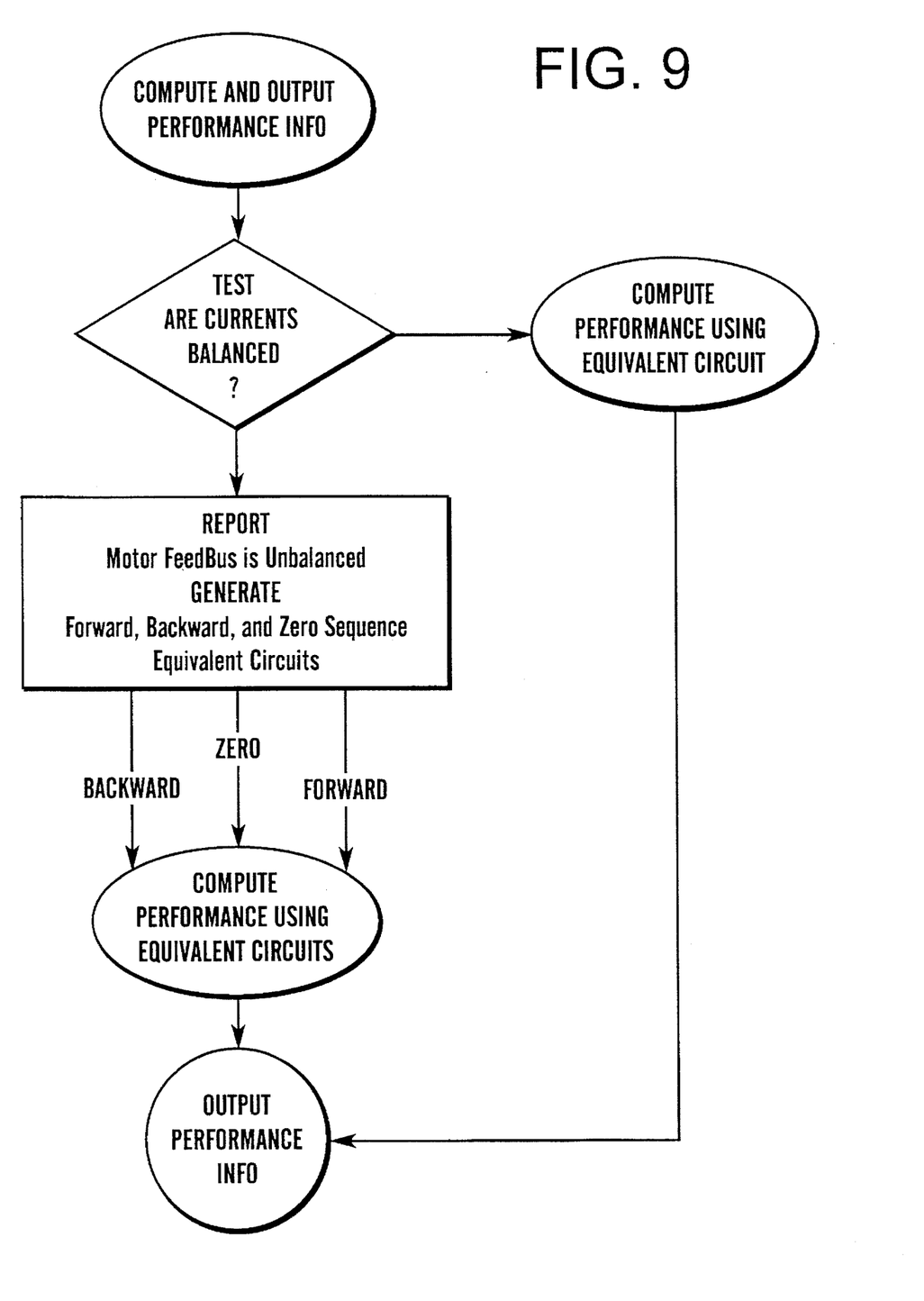

The procedure for computing and outputting performance information, where the impedances are balanced, is summarized in FIG. 9. If the motor feed currents are balanced, the performance information is computed using the motor's equivalent circuit and the performance information is output to the individual conducting the test. If the currents are not balanced, the motor feedbus is not balanced. This fact is reported to the user, and forward, backward, and zero sequence equivalent circuits are generated. Performance information is then computed using the forward, backward, and zero sequence equivalent circuits and the resultant performance data is output to the individual conducting the test.

Figure 10:
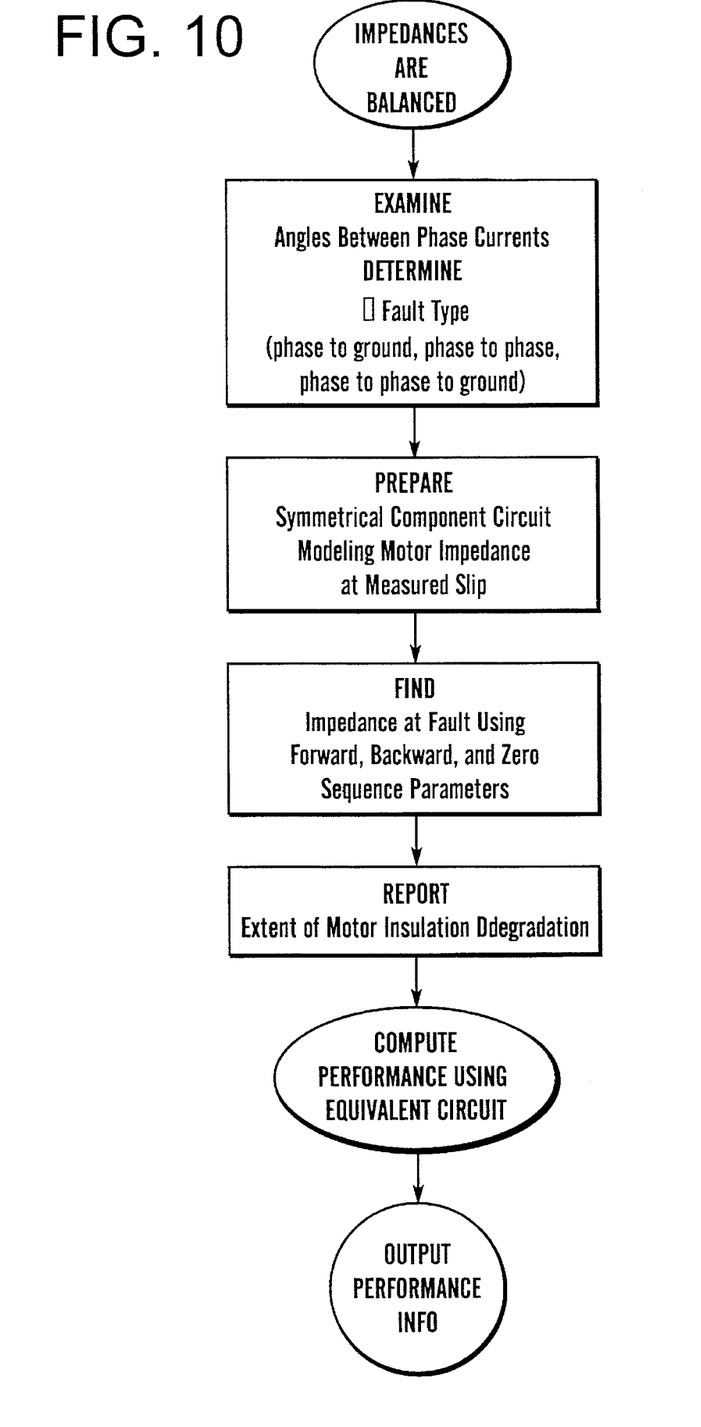

With reference to FIG. 10, if the impedances are not balanced, the angles between phase currents are examined and the fault type (e.g., phase to ground, phase to phase, phase to phase to ground, etc.) is determined. Then a symmetrical component circuit, modeling motor impedance at measured slip, is prepared. The impedance at the fault is then determined using forward, backward, and zero sequence parameters. Once the impedance at the fault is determined, the extent of motor insulation degradation is reported to the user. Finally, the motor's performance information is calculated using the motor's equivalent circuit and the performance information is output to the individual conducting the test.

FIGS. 11a–11e illustrate typical examples of phase distortion based upon a variety of different faults in poly-phase electrical motors. (From *Applied Protective Relaying*, Westinghouse Electric Corporation, Relay Instrument Division, Coral Springs, Fla., page 2–10). The diagrams shown are for effectively grounded systems. In all cases, the dotted or uncollapsed voltage triangle exists in the source (eg., generator) and the maximum collapse is at the fault location. The voltages in between will vary between these extremes, depending upon the point of measurement.

Figure 11A:
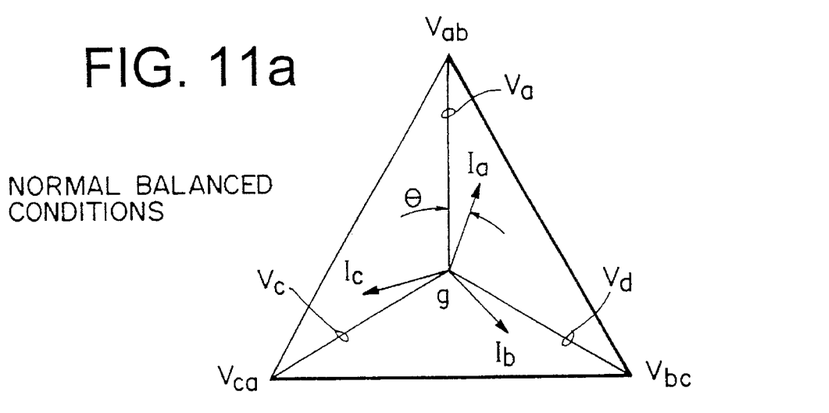
FIG. 11a is a phasor diagram for a three-phase system under normal balanced conditions.
Figure 11B:
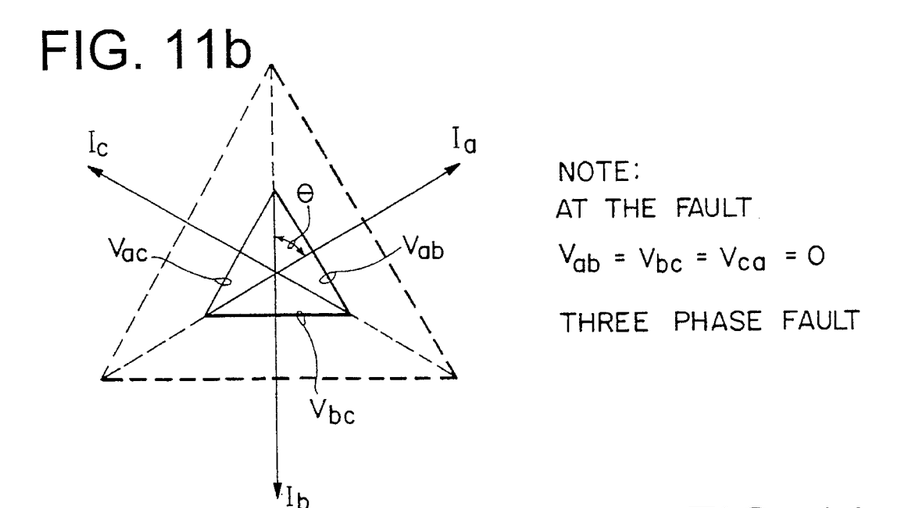
FIG. 11b is a phasor diagram for a three-phase system having a three phase fault.
Figure 11C:
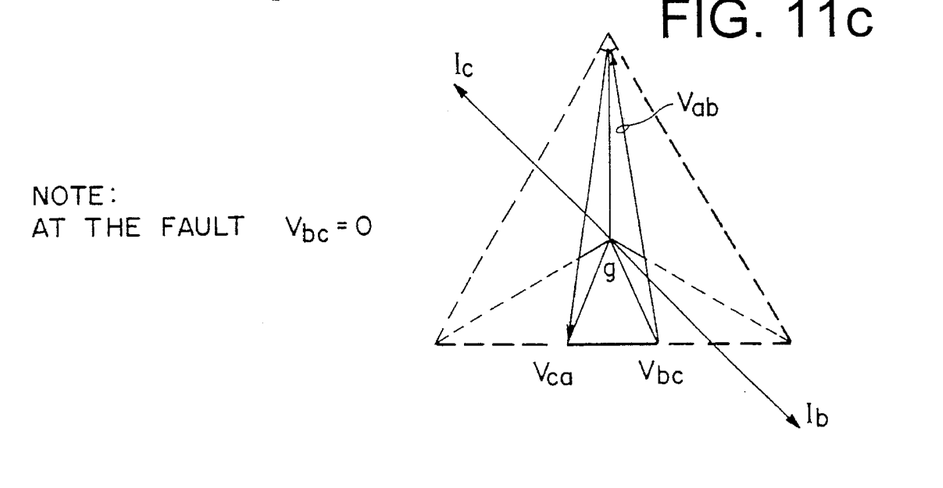
FIG. 11c is a phasor diagram for a three-phase system having a phase b-to-phase c fault.
Figure 11D:
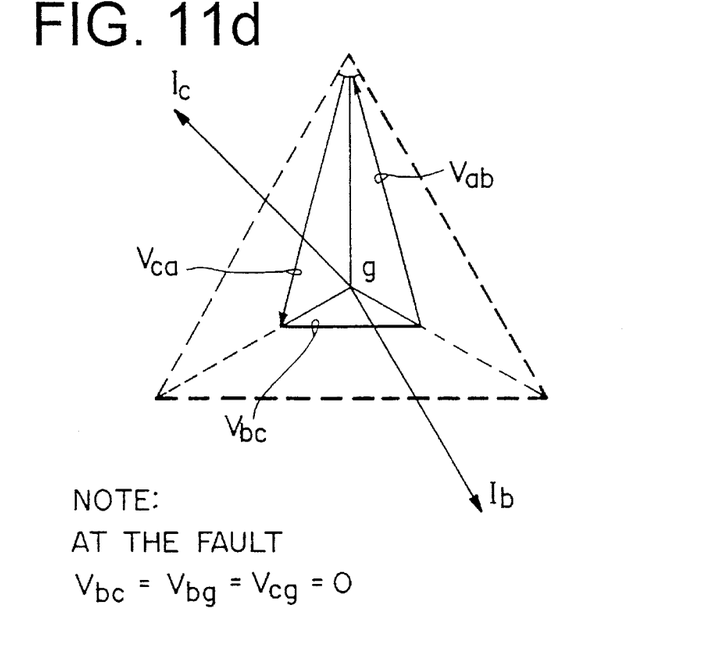
FIG. 11d is a phasor diagram for a three-phase system having a phase b-to-phase c-to-ground fault.
Figure 11E:
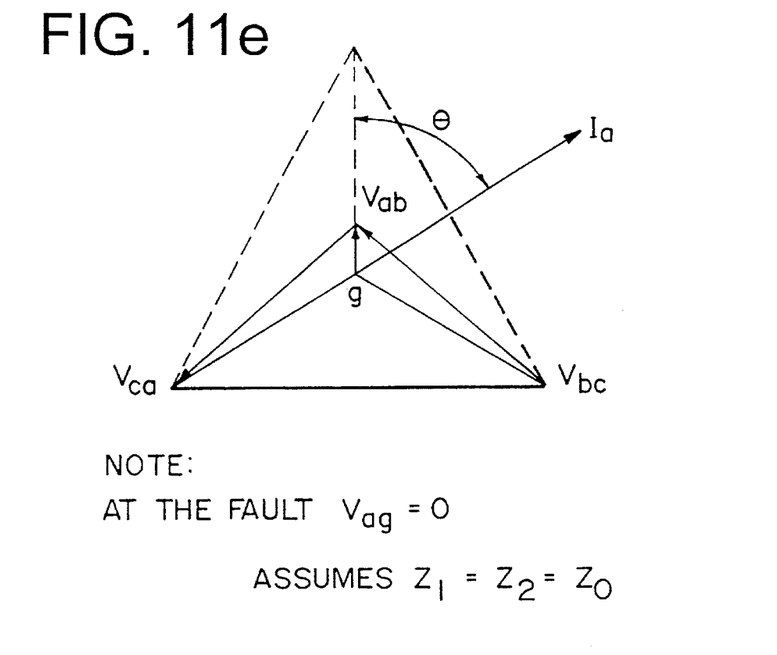
FIG. 11e is a phasor diagram for a three-phase system having a phase a-to-ground fault.

With reference to FIG. 11a, a phasor diagram for a three-phase system under normal balanced conditions is shown. In contrast, FIG. 11b discloses a phasor diagram for a three-phase system having a three-phase fault, while FIG. 11c discloses a phasor diagram for a three-phase system having a phase b-to-phase c fault. Additionally, FIG. 11d is a phasor diagram for a three-phase system having a phase b-to-phase c-to-ground fault and FIG. 11e is a phasor diagram for a three-phase system having a phase a-to-ground fault.

It should also be noted that zero sequence current is calculated using symmetrical components analysis techniques to assess ground fault magnitude.

The subject invention is expected to find use in monitoring a wide variety of electrical poly-phase motors. While it has been shown and described what is at present considered the preferred embodiment of the invention, it will be obvious to those skilled in the art that various changes and modifications may be made therein without departing from the scope of the invention as defined by the appended claims.

What is claimed is:

1. A method for assessing the condition of an operating electrical motor, comprising the steps of:

measuring electrical variables associated with the functioning of said operating electrical motor, wherein said electrical variables include currents and voltages;

applying symmetrical components analysis to said electrical variables; and classifying the type of fault in said operating motor based upon said symmetrical components analysis.

2. A method according to claim 1, wherein said electrical motor is a poly-phase motor.

3. A method according to claim 1, wherein said electrical motor is a three-phase motor.

4. A method according to claim 3, wherein said current is a three-phase current.

5. A method according to claim 4, wherein said three-phase current is measured at a source of power for said three-phase motor or motor terminals of said three-phase motor.

6. A method according to claim 1, wherein current imbalance is compared with poly-phase bus terminal voltage to verify that the current imbalance is occurring as a result of insulation degradation in said operating electrical motor.

7. A method according to claim 1, wherein insulation failure mode is assessed by examining current imbalance for phase distortion characteristic of non-symmetrical fault types.

8. The method of claim 1, wherein the step of classifying the type of fault is performed in response to determining that phase impedances are not balanced in said operating motor.

9. The method of claim 1, wherein the step of classifying the type of fault is performed based on magnitudes of and angles between phase currents in said operating motor.

10. The method of claim 1, further comprising the step of determining a magnitude of fault impedance in said operating motor based on poly-phase equivalent circuit and said symmetrical components analysis.

11. A method for assessing the condition of an operating electrical three-phase motor, comprising the steps of:

measuring electrical variables associated with the function of said three-phase motor, wherein said electrical variables include currents and voltages;

calculating the magnitude of fault impedances based on said electrical variables using three-phase equivalent circuit and symmetrical components analysis; and reporting said fault impedances.

12. A method according to claim 11, comprising the further steps of determining insulation degradation based upon said fault impedances and estimating effective reduction in winding turns based upon fault impedances.

13. A method according to claim 11, wherein current imbalance is compared with three-phase bus terminal voltage to verify that the imbalance is occurring as a result of insulation degradation in said operating motor.

14. A method according to claim 11, wherein insulation failure mode is assessed by examining current imbalance for phase distortion characteristic of non-symmetrical fault types.

15. An apparatus for assessing the condition of an operating electrical motor comprising:

means for measuring electrical variables associated with the functioning of said operating electrical motor, wherein said means for measuring electrical variables include means for measuring current and voltage;

means for applying a symmetrical components analysis to said electrical variables; and means for classifying non-symmetrical faults in said operating motor based upon said symmetrical components analysis.

16. An apparatus according to claim 15, including means for comparing current imbalance with three-phase bus terminal voltage to verify that the current imbalance is occurring as a result of insulation degradation in said operating electrical motor.

17. An apparatus according to claim 15, including means for assessing insulation failure mode by examining current imbalance for phase distortion characteristic of non-symmetrical fault types.

18. An apparatus according to claim 15, wherein said means for applying includes means for determining the magnitude of fault impedances and estimating effective reduction in winding turns.

* * * * *